(12) United States Patent
Huang

(10) Patent No.: US 11,495,534 B2
(45) Date of Patent: Nov. 8, 2022

(54) SEMICONDUCTOR DEVICE WITH TEST PAD AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 71 days.

(21) Appl. No.: 17/228,131

(22) Filed: Apr. 12, 2021

(65) Prior Publication Data

US 2022/0328400 A1 Oct. 13, 2022

(51) Int. Cl.
| | |
|---|---|
| H01L 21/00 | (2006.01) |
| H01L 23/522 | (2006.01) |
| H01L 21/48 | (2006.01) |
| H01L 23/00 | (2006.01) |
| H01L 23/528 | (2006.01) |
| H01L 21/66 | (2006.01) |

(52) U.S. Cl.
CPC ........ *H01L 23/5226* (2013.01); *H01L 21/486* (2013.01); *H01L 22/32* (2013.01); *H01L 23/528* (2013.01); *H01L 24/14* (2013.01)

(58) Field of Classification Search
CPC .... H01L 23/5226; H01L 21/486; H01L 22/32
See application file for complete search history.

(56) References Cited

U.S. PATENT DOCUMENTS

| | | | | | |
|---|---|---|---|---|---|
| 5,554,940 | A * | 9/1996 | Hubacher | .......... | G01R 1/07314 324/762.03 |
| 7,057,405 | B2 * | 6/2006 | Pu | ...................... | G01R 31/2831 324/754.18 |
| 8,593,197 | B1 * | 11/2013 | Cheng | .................. | H03L 7/0812 327/158 |
| 8,704,529 | B2 * | 4/2014 | Dale | .............. | G01R 31/318572 324/555 |
| 8,704,541 | B2 * | 4/2014 | Dale | .................. | G01R 31/2884 324/750.01 |
| 10,840,159 | B2 * | 11/2020 | Park | ........................ | H01L 22/32 |
| 11,088,095 | B2 * | 8/2021 | Chou | ...................... | H01L 24/97 |
| 11,387,207 | B2 * | 7/2022 | Huang | .................... | H01L 22/00 |

(Continued)

FOREIGN PATENT DOCUMENTS

| | | | | | |
|---|---|---|---|---|---|
| CN | 101673694 | A * | 3/2010 | ......... | G01R 1/07378 |
| CN | 103718289 | A * | 4/2014 | ............. | H01L 21/56 |
| WO | WO-2020026387 | A1 * | 2/2020 | | |

*Primary Examiner* — Laura M Menz
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a circuit layer positioned on the substrate and including a functional block positioned on the substrate, and a test pad positioned on the substrate and distal from the functional block, a redistribution structure positioned on the circuit layer and including a first conductive portion positioned over the functional block and electrically coupled to the functional block, and a second conductive portion positioned over the test pad and electrically coupled to the test pad, and a through semiconductor via physically and electrically coupled to the test pad.

20 Claims, 15 Drawing Sheets

(56) References Cited

U.S. PATENT DOCUMENTS

| | | | |
|---|---|---|---|
| 2005/0007129 A1* | 1/2005 | Pu | G01R 31/2831 |
| | | | 324/754.18 |
| 2012/0305916 A1* | 12/2012 | Liu | H01L 23/585 |
| | | | 257/E23.151 |
| 2015/0380324 A1* | 12/2015 | Liu | H01L 23/49822 |
| | | | 257/48 |
| 2018/0025955 A1* | 1/2018 | Rusli | H01L 23/49816 |
| | | | 438/108 |
| 2018/0204828 A1* | 7/2018 | Lu | H01L 22/32 |
| 2018/0374785 A1* | 12/2018 | Chang | H01L 23/3114 |
| 2019/0221546 A1* | 7/2019 | Yazdani | H01L 23/66 |
| 2020/0328173 A1* | 10/2020 | Yu | H01L 21/56 |
| 2020/0357785 A1* | 11/2020 | Lu | H01L 23/3185 |
| 2020/0411472 A1* | 12/2020 | Chung | H01L 25/105 |
| 2021/0035955 A1* | 2/2021 | Yazdani | H01L 23/481 |
| 2021/0104482 A1* | 4/2021 | Hong | H01L 24/05 |
| 2021/0257304 A1* | 8/2021 | Shih | H01L 21/6835 |
| 2021/0400819 A1* | 12/2021 | Lin | H05K 3/3436 |
| 2022/0157761 A1* | 5/2022 | Huang | H01L 22/00 |
| 2022/0246565 A1* | 8/2022 | Yang | H01L 23/5223 |

* cited by examiner

SEMICONDUCTOR DEVICE WITH TEST PAD AND METHOD FOR FABRICATING THE SAME

TECHNICAL FIELD

The present disclosure relates to a semiconductor device and a method for fabricating the semiconductor device, and more particularly, to a semiconductor device with a test pad and a method for fabricating the semiconductor device with the test pad.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a circuit layer positioned on the substrate and including a functional block positioned on the substrate, and a test pad positioned on the substrate and distal from the functional block, a redistribution structure positioned on the circuit layer and including a first conductive portion positioned over the functional block and electrically coupled to the functional block, and a second conductive portion positioned over the test pad and electrically coupled to the test pad, and a through semiconductor via physically and electrically coupled to the test pad.

In some embodiments, the functional block and the first conductive portion of the redistribution structure are electrically coupled through a multi-level interconnect structure of the circuit layer.

In some embodiments, the first conductive portion of the redistribution structure and the second conductive portion of the redistribution structure are electrically coupled.

In some embodiments, the semiconductor device includes a first passivation layer positioned between the circuit layer and the redistribution structure. The first passivation layer includes polybenzoxazole, polyimide, benzocyclobutene, solder resist film, silicon oxynitride, phosphosilicate glass, borosilicate glass, or boron-doped phosphosilicate glass.

In some embodiments, the through semiconductor via includes a filler layer positioned along the first passivation layer and extending to the circuit layer, and two insulation layers positioned on two sides of the filler layer. The two insulation layers comprise silicon oxide, silicon nitride, silicon oxynitride, tetra-ethyl ortho-silicate, parylene, epoxy, or poly(p-xylene).

In some embodiments, the through semiconductor via includes a seed layer positioned between the two insulation layers and the filler layer and between the filler layer and the test pad, and electrically coupled to the filler layer and the test pad.

In some embodiments, the through semiconductor via includes an adhesive layer positioned between the seed layer and the two insulation layers and between the seed layer and the test pad, and electrically coupled to the seed layer and the test pad. The adhesive layer includes titanium, tantalum, titanium tungsten, or manganese nitride.

In some embodiments, the through semiconductor via includes a barrier layer positioned between the adhesive layer and the two insulation layers and between the adhesive layer and the test pad, and electrically coupled to the adhesive layer and the test pad. The barrier layer includes tantalum, tantalum nitride, titanium, titanium nitride, rhenium, nickel boride, or tantalum nitride/tantalum bilayer.

In some embodiments, sidewalls of the through semiconductor via are tapered.

In some embodiments, the functional block includes a complementary metal-oxide-semiconductor transistor, a metal-oxide-semiconductor field-effect transistor, or a fin field-effect-transistor, or the like.

In some embodiments, the redistribution structure includes a first insulation layer positioned on the first passivation layer, and the first conductive portion and the second conductive portion are positioned in the first insulation layer. The first insulation layer includes polybenzoxazole, polyimide, benzocyclobutene, solder resist film, silicon oxynitride, phosphosilicate glass, borosilicate glass, or boron-doped phosphosilicate glass.

In some embodiments, the second conductive portion of the redistribution structure includes a conductor layer positioned in the first insulation layer and electrically coupled to the through semiconductor via, and a barrier layer positioned between the first insulation layer and the conductor layer, between the circuit layer and the conductor layer, and between the through semiconductor via and the conductor layer.

In some embodiments, the second conductive portion of the redistribution structure includes a seed layer positioned between the conductor layer and the barrier layer.

In some embodiments, the semiconductor device includes a thermal dissipation layer positioned below the substrate. The thermal dissipation layer includes vertically oriented graphite and carbon nanotubes.

In some embodiments, the semiconductor device includes an attachment layer positioned between the thermal dissipation layer and the substrate. The attachment layer includes die attach film, silver paste, or the like.

In some embodiments, the semiconductor device includes a plurality of first connectors positioned on the redistribution structure and respectively correspondingly electrically coupled to the first conductive portion of the redistribution structure and the second conductive portion of the redistribution structure. The plurality of first connectors includes solder joints, bumps, pillar bumps, or the like.

In some embodiments, the semiconductor device includes a plurality of under bump metallization layer respectively correspondingly positioned between the plurality of first connectors and the redistribution structure.

In some embodiments, the through semiconductor via includes two assistance layers respectively correspondingly positioned between the two insulation layers and the filler layer. Bottommost points of the two assistance layers are at a vertical level lower than a vertical level of a bottom surface of the first passivation layer.

Another aspect of the present disclosure provides a method for fabricating a semiconductor device including providing a substrate, forming a circuit layer on the substrate and including a functional block on the substrate, and a test pad on the substrate and distal from the functional block, forming a through semiconductor via physically and electrically coupled to the test pad, and forming a redistribution structure on the circuit layer and including a first conductive portion over the functional block and electrically coupled to the functional block, and a second conductive portion over the test pad and electrically coupled to the test pad through the through semiconductor via.

In some embodiments, the method for fabricating the semiconductor device includes forming a plurality of first connectors on the redistribution structure and respectively correspondingly electrically coupled to the first conductive portion of the redistribution structure and the second conductive portion of the redistribution structure. The plurality of first connectors includes solders, bumps, pillar bumps, or the like.

Due to the design of the semiconductor device of the present disclosure, the semiconductor device may be in conjunction with testing methodologies that incorporate intermediate and/or final verification of known good dies. As a result, the yield of fabricating the semiconductor device may be improved and the cost of fabricating the semiconductor device may be decreased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
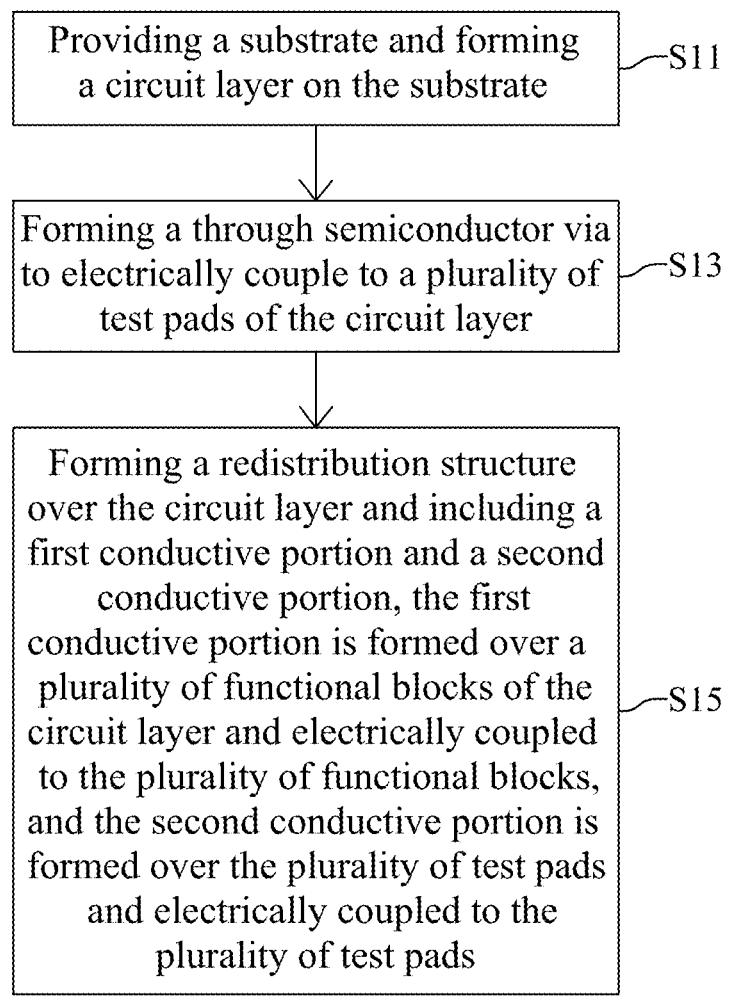
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
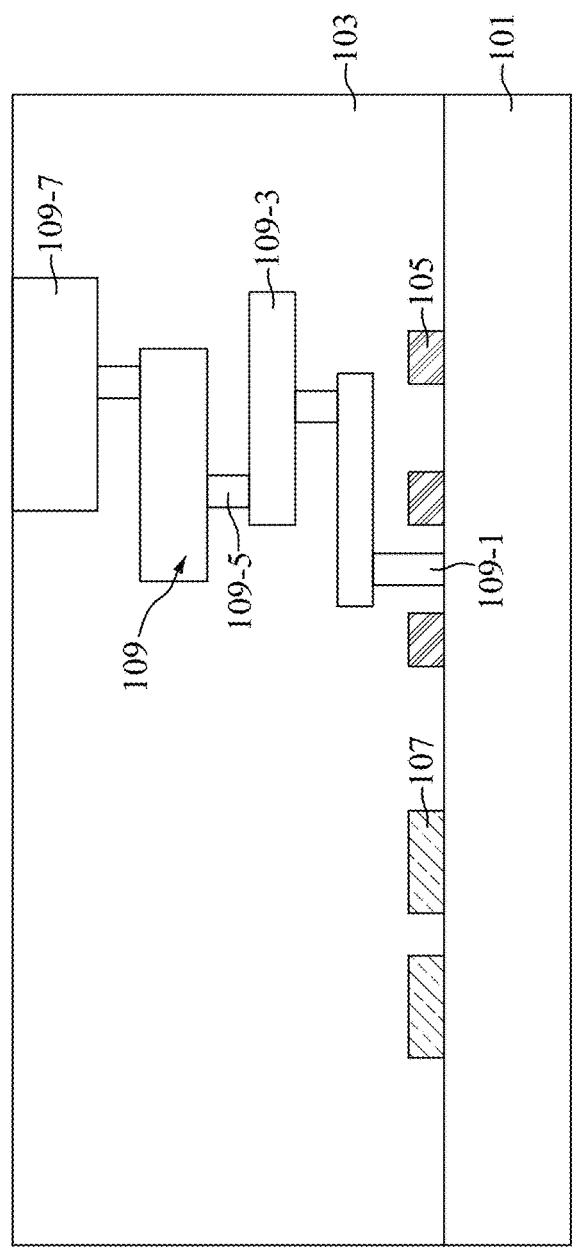
FIGS. 2 and 3 illustrate, in schematic cross-sectional view diagrams, part of a flow for fabricating the semiconductor device in accordance with one embodiment of the present disclosure.
Figure 3:
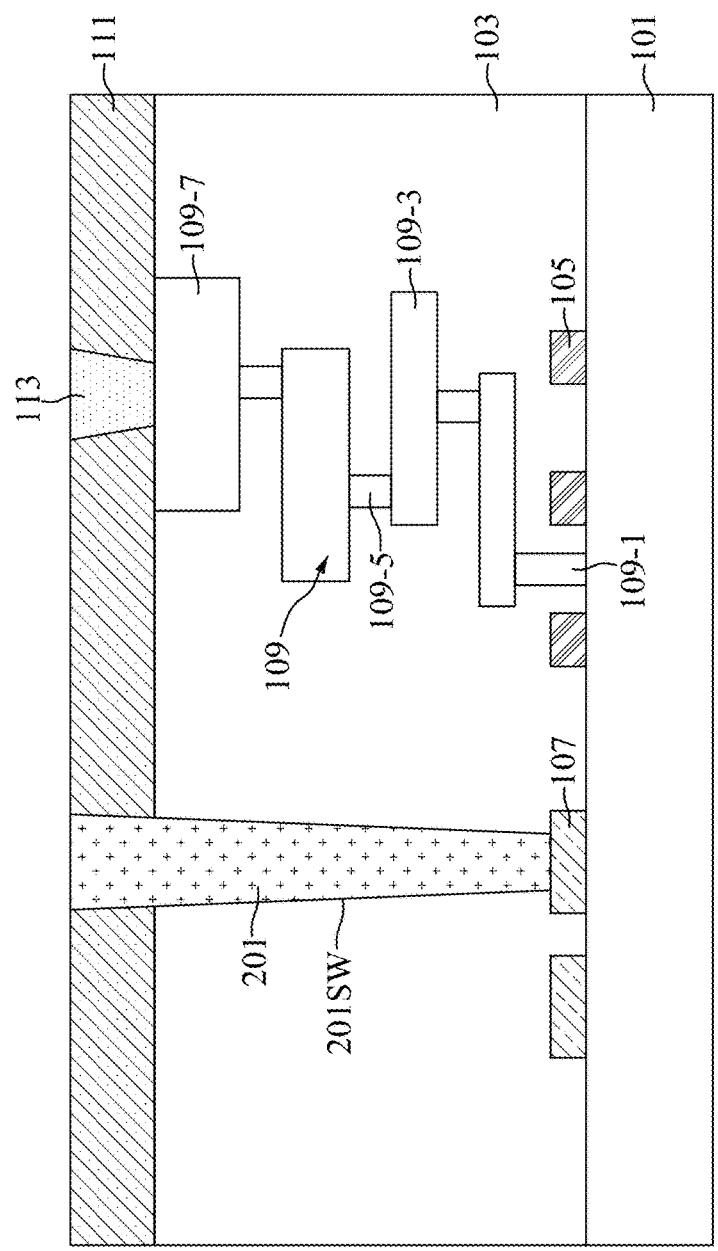
Figure 4:
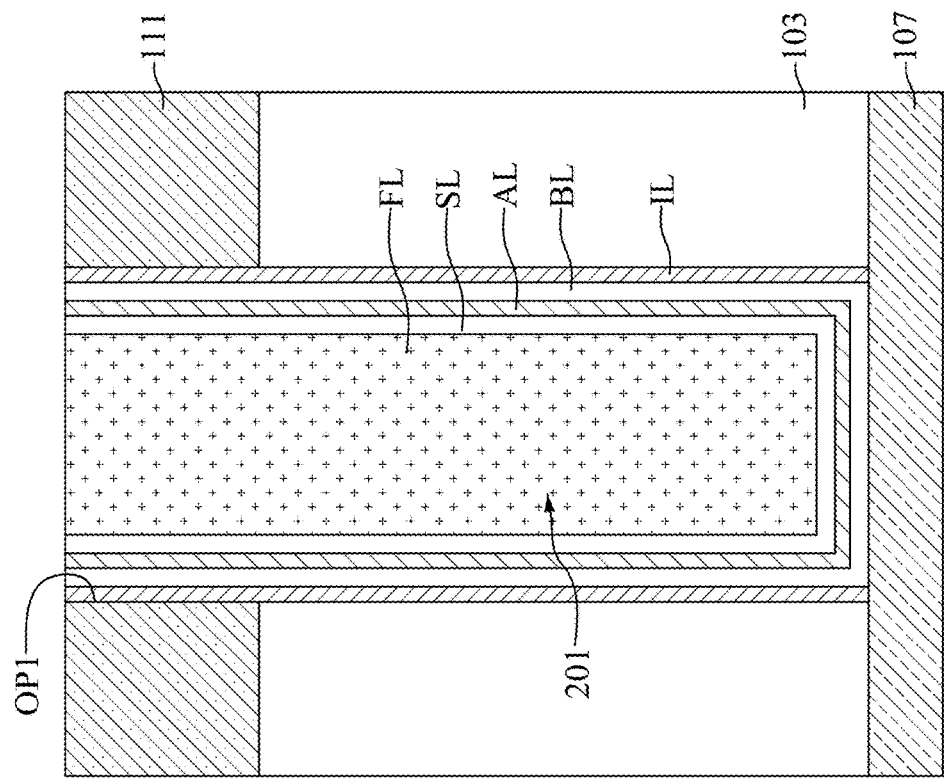
FIG. 4 illustrates, in a schematic close-up cross-sectional view diagram, a through semiconductor via of the semiconductor device in accordance with one embodiment of the present disclosure.

FIG. 1 illustrates, in a flowchart diagram form, a method 10 for fabricating a semiconductor device SD1A in accordance with one embodiment of the present disclosure. FIGS. 2 and 3 illustrate, in schematic cross-sectional view diagrams, part of a flow for fabricating the semiconductor device SD1A in accordance with one embodiment of the present disclosure. FIG. 4 illustrates, in a schematic close-up cross-sectional view diagram, a through semiconductor via of the semiconductor device SD1A in accordance with one embodiment of the present disclosure.

With reference to FIG. 1, at step S11, a substrate 101 may be provided and a circuit layer 103 may be formed on the substrate 101.

With reference to FIG. 2, the substrate 101 may include a bulk semiconductor substrate that is composed at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of in any order, silicon oxide and silicon nitride or boron nitride. The insulator layer may have a thickness between about 10 nm and about 200 nm. The insulator layer may eliminate leakage current and reduces parasitic capacitance of the semiconductor device SD1A.

It should be noted that, in the description of the present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the circuit layer 103 may be formed on the substrate 101. The circuit layer 103 may include inter-layer dielectric layers and/or inter-metal dielectric layers containing a plurality of functional blocks 105, a multi-level interconnect structure 109, and a plurality of test pads 107. The plurality of functional blocks 105 may be transistors such as complementary metal-oxide-semiconductor transistors, metal-oxide-semiconductor field-effect transistors, fin field-effect-transistors, the like, or a combination thereof. The plurality of functional blocks 105 may cooperate together and provide a variety of functionalities such as logic, I/O, memory, analog circuits, and the like.

The multi-level interconnect structure 109 may include a plurality of conductive plugs 109-1, a plurality of conductive lines 109-3, a plurality of conductive vias 109-5, and a plurality of conductive pads 109-7, or other suitable conductive elements. The plurality of conductive plugs 109-1 may physically and electrically coupled to the plurality of functional blocks 105. The plurality of conductive lines 109-3 may be separated from each other and may be horizontally disposed in the inter-layer dielectric layers and/or inter-metal dielectric layers along the direction Z. In the description of the present disclosure, the topmost conductive lines 109-3 may be designated as the plurality of conductive pads 109-7. The top surfaces of plurality of conductive pads 109-7 may be substantially coplanar with the top surface of the circuit layer 103. The plurality of conductive vias 109-5 may connect adjacent conductive lines 109-3 along the direction Z. In some embodiments, the plurality of conductive vias 109-5 may improve heat dissipation in the circuit layer 103 and may provide structure support in the circuit layer 103.

It should be noted that, in the description of the present disclosure, the number of the conductive plugs 109-1, the conductive lines 109-3, the conductive vias 109-5, and the conductive pads 109-7 are just for illustration purpose. The number of aforementioned conductive features may be more or less than that shown in FIG. 2.

The inter-layer dielectric layers and/or the inter-metal dielectric layers may be formed of for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The inter-layer dielectric layers and/or the inter-metal dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. The plurality of functional blocks 105 and the multi-level interconnect structure 109 may be formed during the formation of the inter-layer dielectric layers and/or the inter-metal dielectric layers.

It should be noted that, in the description of the present disclosure, a surface is "substantially flat" if there exists a horizontal plane from which the surface does not deviate by more than three times the root mean square roughness of the surface.

The multi-level interconnect structure 109 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The plurality of test pads 107 may be formed on the substrate 101 and may be distal from the plurality of functional blocks 105. In some embodiments, in a top-view perspective (not shown), the plurality of functional blocks 105 may be located at a central region of the substrate 101 and the plurality of test pads 107 may be located at a peripheral region of the substrate 101. The plurality of test pads 107 may allow the testing of the semiconductor device SD1A, the use of probes and/or probe cards, and the like. The verification testing may be performed on intermediate structures as well as the final structure. Additionally, the structures and methods in the description of present disclosure may be used in conjunction with testing methodologies that incorporate intermediate and/or final verification of known good dies to increase the yield and decrease costs.

With reference to FIGS. 1, 3, and 4, at step S13, a through semiconductor via 201 may be formed to electrically couple to the plurality of test pads 107.

With reference to FIG. 3, a first passivation layer 111 may be formed on the circuit layer 103. The first passivation layer 1/1 may be a single layer structure or a multi-layer structure. In some embodiments, the first passivation layer 111 may include polybenzoxazole, polyimide, benzocyclobutene, solder resist film, or the like, or a combination thereof. In some other embodiments, the first passivation layer 111 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof. The first passivation layer 111 may be formed by, for example, spin-coating, lamination, deposition, or the like. The deposition may include chemical vapor deposition. In some embodiments, the first passivation layer 111 may be designated as part of the inter-layer dielectric layers and/or the inter-metal dielectric layers of the circuit layer 103.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 3, a top conductive via 113 may be formed along the first passivation layer 11/ and physically and electrically coupled to a corresponding conductive pad 109-7 of the multi-level interconnect structure 109. In other words, the top conductive via 113 may be electrically coupled to the plurality of functional blocks 105 through the multi-level interconnect structure 109. The top conductive via 113 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 3, the through semiconductor via 201 may be formed along the first passivation layer 111, extending to the circuit layer 103, and physically and electrically coupled to a corresponding test pad 107. In some embodiments, the sidewalls 201SW of the through semiconductor via 201 may be substantially vertical. In some embodiments, the sidewalls 201SW of the through semiconductor via 201 may be tapered. For example, an angle between the sidewall 201SW of the through semiconductor via 201 and the top surface of the first passivation layer 111 may be between about 85 degree and about 88 degree.

With reference to FIG. 4, the through semiconductor via 201 may be formed by forming a first opening OP1 at least partially expose the corresponding test pad 107 and subsequently filling the first opening OP1. Specifically, the through semiconductor via 201 may include a filler layer FL, a seed layer SL, an adhesive layer AL, a barrier layer BL, and two insulation layers IL.

With reference to FIG. 4, an insulation material may be conformally formed on two sidewalls and a bottom surface of the first opening OP1. A punch etch process may be performed to remove the insulation material formed on the bottom surface of the first opening OP1. The remained insulation material on the two sidewalls of the first opening OP1 may be referred to as the two insulation layers IL. In some embodiments, the two insulation layers IL may be formed of, for example, silicon oxide, silicon nitride, silicon oxynitride, or tetra-ethyl ortho-silicate. The two insulation layers IL may have a thickness between about 50 nm and about 200 nm. Alternatively, in some embodiments, the two insulation layers IL may be formed of, for example, parylene, epoxy, or poly(p-xylene). The two insulation layers IL may have a thickness between about 1 μm and about 5 μm. The two insulation layers IL may ensure the filler layer FL is electrically isolated in the circuit layer 103 and the first passivation layer 111.

With reference to FIG. 4, the barrier layer BL may be conformally formed on the two insulation layers IL and on the bottom surface of the first opening OP1. The barrier layer BL may have a U-shaped cross-sectional profile. The barrier layer BL may be electrically coupled to the corresponding test pad 107. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the two insulation layers IL, the circuit layer 103, or the first passivation layer 111. The barrier layer BL may be formed by deposition process such as physical vapor deposition, atomic layer deposition, chemical vapor deposition, or sputtering.

With reference to FIG. 4, the adhesive layer AL may be conformally formed on the barrier layer BL and may have a U-shaped cross-sectional profile. The adhesive layer AL may be electrically coupled to the barrier layer BL. The adhesive layer AL may be formed of, for example, titanium, tantalum, titanium tungsten, or manganese nitride. The adhesive layer AL may improve an adhesion between the seed layer SL and the barrier layer BL. The adhesive layer AL may have a thickness between about 5 nm and about 50 nm. The adhesive layer AL may be formed by deposition process such as physical vapor deposition, atomic layer deposition, chemical vapor deposition, or sputtering.

With reference to FIG. 4, the seed layer SL may be conformally formed on the adhesive layer AL and may have a U-shaped cross-sectional profile. The seed layer SL may be electrically coupled to the adhesive layer AL. The seed layer SL may have a thickness between about 10 nm and about 40 nm. The seed layer SL may be formed of, for example, copper or ruthenium. The seed layer SL may be formed by deposition process such as physical vapor deposition, atomic layer deposition, chemical vapor deposition, or sputtering. The seed layer SL may reduce resistivity of the first opening OP1 during the formation of the filler layer FL by an electroplating process.

With reference to FIG. 4, the filler layer FL may be formed on the seed layer SL and completely fill the first opening OP1. The filler layer FL may be, for example, copper. The filler layer FL may be formed by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the first opening OP1. Therefore, most of suppressing effect may occur at the upper part of the first opening OP1, helping to reduce overburden of the filling material (e.g., copper) and avoid the first opening OP1 "closing".

The leveler may be used to improve filling performance, decrease the surface roughness, and prevent copper deposition at the upper part of the first opening OP1. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propanesulfonate).

Figure 5:
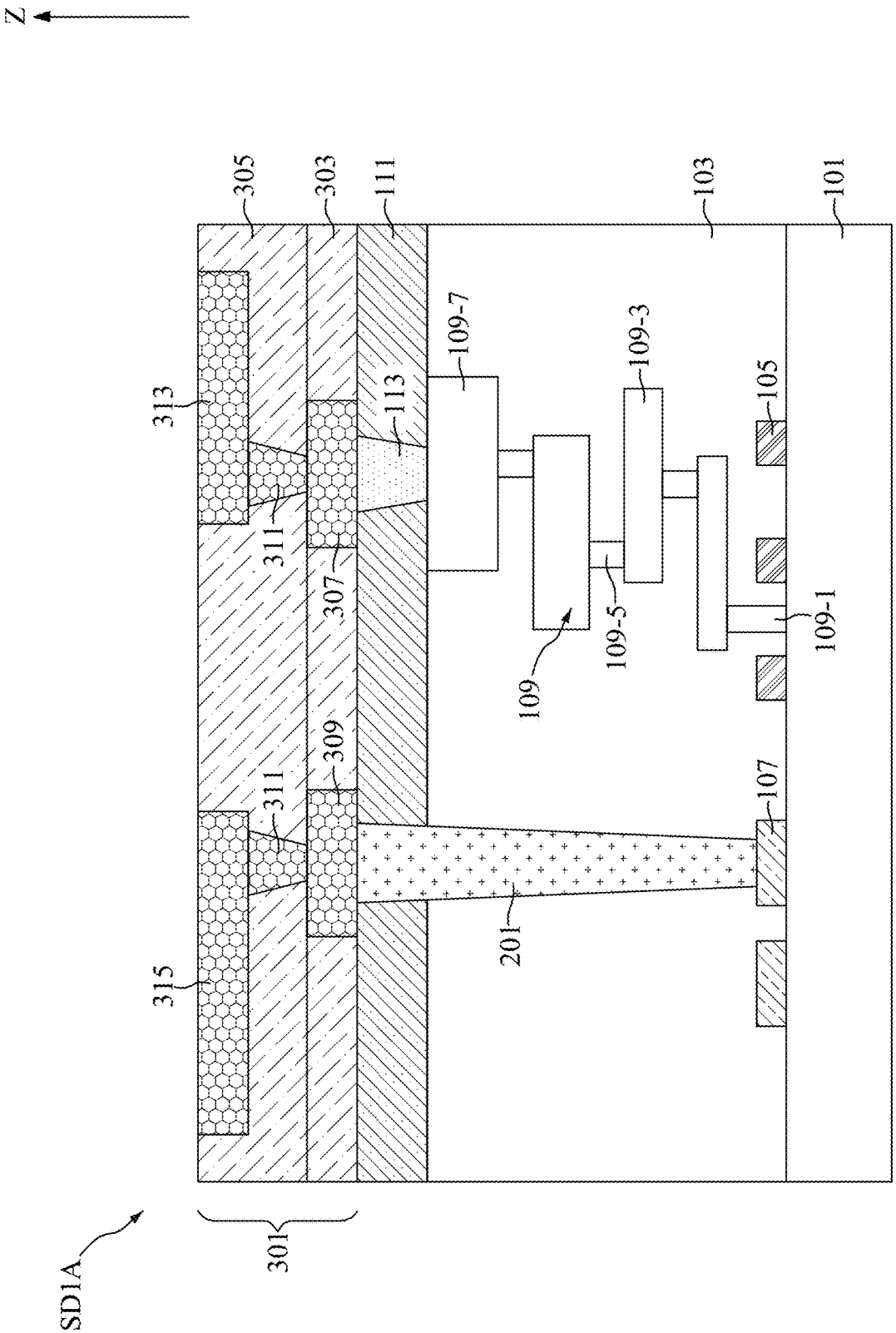
FIG. 5 illustrates, in a schematic cross-sectional view diagram, part of the flow for fabricating the semiconductor device in accordance with one embodiment of the present disclosure.
Figure 6:
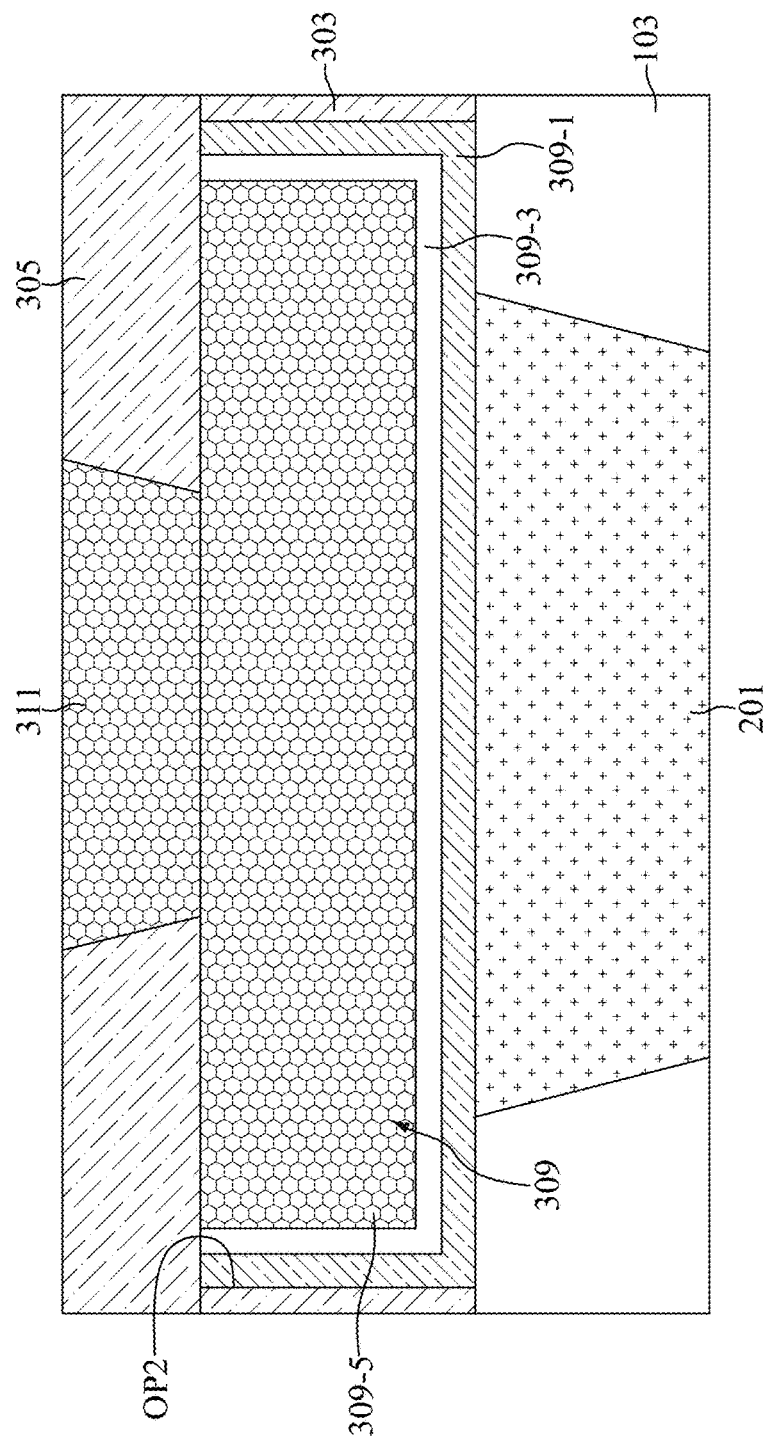
FIG. 6 illustrates, in a schematic close-up cross-sectional view diagram, a second conductive portion of the semiconductor device in accordance with one embodiment of the present disclosure.

FIG. 5 illustrates, in a schematic cross-sectional view diagram, part of the flow for fabricating the semiconductor device SD1A in accordance with one embodiment of the present disclosure. FIG. 6 illustrates, in a schematic close-up cross-sectional view diagram, a second conductive portion 309 of the semiconductor device SD1A in accordance with one embodiment of the present disclosure.

With reference to FIGS. 1, 5, and 6, at step S15, a redistribution structure 301 may be formed over the circuit layer 103 and including a first conductive portion 307 and a second conductive portion 309, wherein the first conductive portion 307 may be formed over the plurality of functional blocks 105 and electrically coupled to the plurality of functional blocks 105, and the second conductive portion 309 may be formed over the plurality of test pads 107 and electrically coupled to the plurality of test pads 107.

With reference to FIG. 5, the redistribution structure 301 may include a first insulation layer 303, a first insulation layer 303, the first conductive portion 307, the second conductive portion 309, a plurality of connection vias 311, a first top conductive layer 313, and a second top conductive layer 315.

Generally, the formation of redistribution structure 301 may include forming one or more insulation layers (i.e., the first insulation layer 303 and the second insulation layer 305) using any suitable method (e.g., a spin-on coating technique, sputtering, and the like) and forming conductive features (i.e., the first conductive portion 307, the second conductive portion 309, the plurality of connection vias 311, the first top conductive layer 313, and the second top conductive layer 315) in the insulation layers. The formation of the conductive features may include patterning the insulation layers (e.g., using photolithography and/or etching processes) and forming conductive features in the patterned insulation layers (e.g., by depositing a seed layer, using a mask layer to define the shape of the conductive features, and using an electroless/electrochemical plating process).

With reference to FIG. 5, the first insulation layer 303 may be formed on the first passivation layer 111. In some embodiments, the first insulation layer 303 may include polybenzoxazole, polyimide, benzocyclobutene, solder resist film, the like, or a combination thereof. In some other embodiments, the first insulation layer 303 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof. The first insulation layer 303 may be formed by, for example, spin-coating, lamination, deposition, or the like. The deposition may include chemical vapor deposition.

With reference to FIG. 5, the second insulation layer 305 may be formed on the first insulation layer 303. In some embodiments, the second insulation layer 305 may include polybenzoxazole, polyimide, benzocyclobutene, solder resist film, the like, or a combination thereof. In some other embodiments, the second insulation layer 305 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof. The second insulation layer 305 may be formed by, for example, spin-coating, lamination, deposition, or the like. The deposition may include chemical vapor deposition. The first insulation layer 303 and the second insulation layer 305 may be formed of a same material but are not limited thereto.

With reference to FIG. 5, the first conductive portion 307 may be formed along the first insulation layer 303 and over the plurality of functional blocks 105. The first conductive portion 307 may be physically and electrically coupled to the top conductive via 113. The first conductive portion 307 and the plurality of functional blocks 105 may be electrically coupled through the top conductive via 113 and the multi-level interconnect structure 109. The second conductive portion 309 may be formed along the first insulation layer 303 and over the plurality of test pads 107. The second conductive portion 309 may be physically and electrically coupled to the through semiconductor via 201. The second conductive portion 309 and the plurality of test pads 107 may be electrically coupled through the through semiconductor via 201.

With reference to FIG. 5, the plurality of connection vias 311 may be formed in the second insulation layer 305. The plurality of connection vias 311 may be respectively correspondingly formed on the first conductive portion 307 and the second conductive portion 309. The plurality of connection vias 311 may be electrically coupled to the first conductive portion 307 and the second conductive portion 309, respectively and correspondingly. The first top conductive layer 313 may be formed in the second insulation layer 305 and over the first conductive portion 307. The first top conductive layer 313 may be electrically coupled to the first conductive portion 307 through the corresponding connection via 311. The second top conductive layer 315 may be formed in the second insulation layer 305 and over the second conductive portion 309. The second top conductive layer 315 may be electrically coupled to the second conductive portion 309 through the corresponding connection via 311.

The first conductive portion 307, the second conductive portion 309, the plurality of connection vias 311, the first top conductive layer 313, and the second top conductive layer 315 may be formed of for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 6, in some embodiments, the second conductive portion 309 may include a seed layer 309-3 and a conductor layer 309-5 formed thereon. The seed layer 309-3 may be conformally formed on two sidewalls and a bottom surface of a second opening OP2 in the first insulation layer 303. The seed layer 309-3 may be a metal seed layer such as a copper seed layer. In some embodiments, the second conductive portion 309 may include a barrier layer 309-1 such as a titanium layer. The seed layer 309-3 may be conformally formed on the barrier layer 309-1. The conductor layer 309-5 may be formed of copper or other suitable metals. In some embodiments, the first conductive portion 307 may have a similar structure as the second conductive portion 309.

FIGS. 7 to 10 illustrate, in schematic cross-sectional view diagrams, semiconductor devices SD1B, SD1C, SD1D, and SD1E in accordance with some embodiments of the present disclosure.

Figure 7:
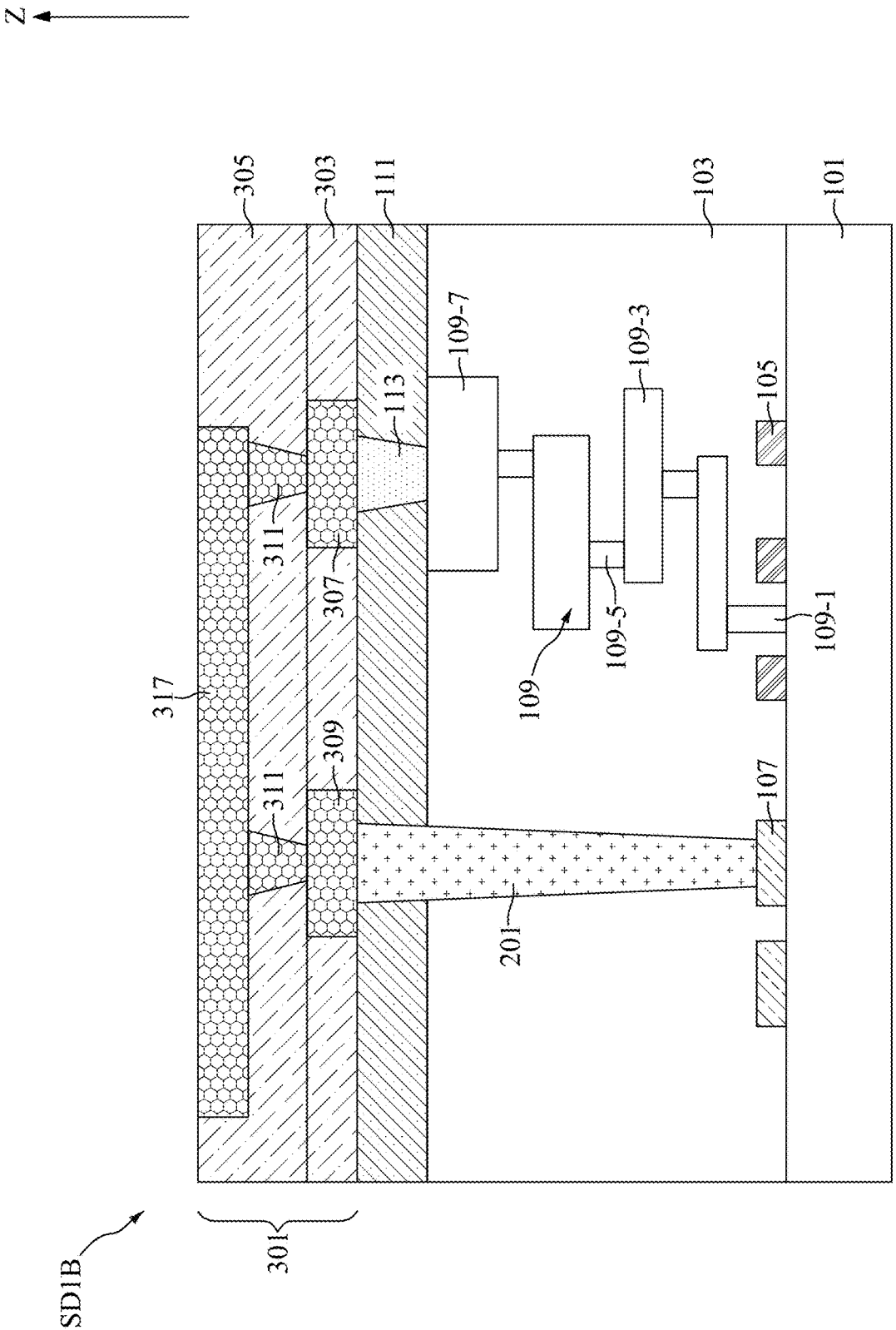
FIGS. 7 to 10 illustrate, in schematic cross-sectional view diagrams, semiconductor devices in accordance with some embodiments of the present disclosure.

With reference to FIG. 7, the semiconductor device SD1B may have a structure similar to that illustrated in FIG. 5. The same or similar elements in FIG. 7 as in FIG. 5 have been marked with similar reference numbers and duplicative descriptions have been omitted. The semiconductor device SD1B may include a third top conductive layer 317 instead of the first top conductive layer 313 and the second top conductive layer 315 (as shown in FIG. 5). The third top conductive layer 317 may be disposed in the second insulation layer 305 and on the plurality of connection vias 311. The third top conductive layer 317 may be concurrently electrically coupled to the first conductive portion 307 and the second conductive portion 309 through the plurality of connection vias 311. The third top conductive layer 317 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 8:
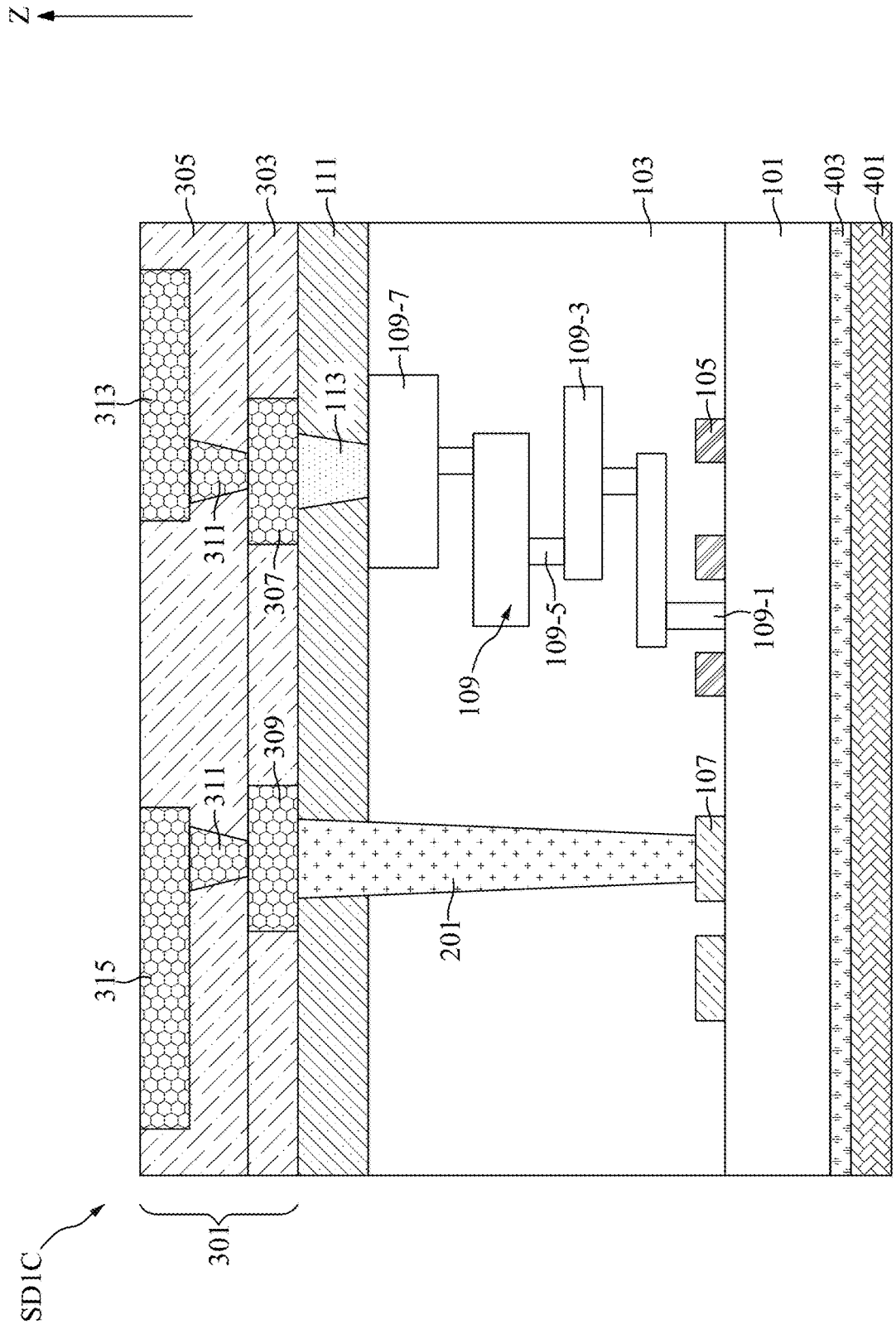

With reference to FIG. 8, the semiconductor device SD1C may have a structure similar to that illustrated in FIG. 5. The same or similar elements in FIG. 8 as in FIG. 5 have been marked with similar reference numbers and duplicative descriptions have been omitted. The semiconductor device SD1C may include a thermal dissipation layer 401 and an attachment layer 403.

With reference to FIG. 8, the thermal dissipation layer 401 may be disposed below the substrate 101. The attachment layer 403 may be used to attach the thermal dissipation layer 401 to the substrate 101. In some embodiments, the attachment layer 403 may include a die attach film, silver paste, or the like. In some embodiments, the thermal dissipation layer 401 may be formed of, for example, a composite material selected from the group consisting of silicon carbide, aluminum nitride, graphite, and the like. The thermal dissipation layer 401 may have a good thermal conductivity, which may be greater than about 2 W/m·K. In some embodiments, the thermal dissipation layer 401 may have high thermal conductivity greater than about 100 W/m·K, and may be formed using a metal, a metal alloy, or the like. For example, the thermal dissipation layer 401 may comprise metals and/or metal alloys selected from the group consisting of aluminum, copper, nickel, cobalt, and the like.

In some embodiments, the thermal dissipation layer 401 may be formed of a carbon material that is imbued with a flexible material such as a polymer matrix. For example, the thermal dissipation layer 401 may include generally vertically oriented graphite and carbon nanotubes, which are imbued with a fluoropolymer rubber matrix. The aspect ratio of the carbon nanotubes may be between about 1:1 and about 1:100. For another example, the thermal dissipation layer 401 may include graphitic carbon. For yet another example, the thermal dissipation layer 401 may include pyrolytic graphite sheet. In some embodiments, a thermal resistance of the thermal dissipation layer 401 may be less than 0.2° C. cm2/Watt at a thickness between about 250 μm and about 450 μm. The thermal dissipation layer 401 may provide additional thermal dissipation capability to the semiconductor device SD1C.

Figure 9:
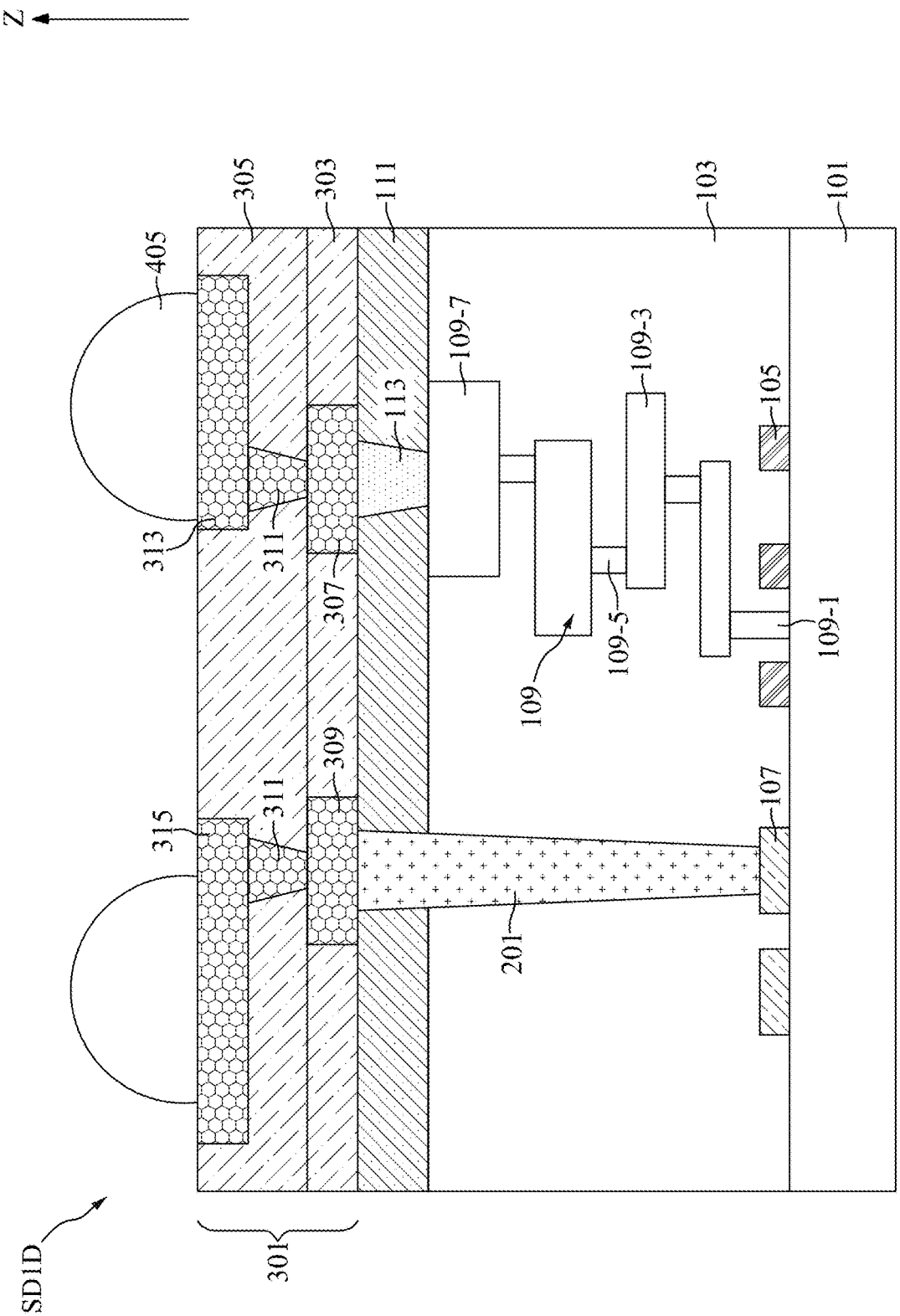

With reference to FIG. 9, the semiconductor device SD1D may have a structure similar to that illustrated in FIG. 5. The same or similar elements in FIG. 9 as in FIG. 5 have been marked with similar reference numbers and duplicative descriptions have been omitted. The semiconductor device SD1D may include a plurality of first connectors 405. The plurality of first connectors 405 may be respectively correspondingly disposed on the first top conductive layer 313 and the second top conductive layer 315. In some embodiments, the plurality of first connectors 405 may include a conductive material with low resistivity, such as tin, lead, silver, copper, nickel, bismuth or an alloy thereof, and may be formed by a suitable process such as evaporation, plating, ball drop, or screen printing. In some embodiments, the plurality of first connectors 405 may be controlled collapse chip connection (i.e., C4) bumps formed by a C4 process.

In some embodiments, the plurality of first connectors 405 may be solder joints. The solder joints may comprise a material such as tin, or other suitable materials, such as silver or copper. In an embodiment in which the solder joints are tin solder joints, the solder joints may be formed by initially forming a layer of tin through evaporation, electroplating, printing, solder transfer, or ball placement to a thickness of about 10 μm to about 100 μm. Once the layer of tin has been formed on the redistribution structure 301, a reflow process may be performed to shape the solder joints into the desired shape.

In some embodiments, the plurality of first connectors 405 may be pillar bumps formed of, for example, copper. The pillar bumps may be formed directly on the first top conductive layer 313 and the second top conductive layer 315, without requiring contact pads, under bump metallization, or the like, thus further reducing cost and process complexity of the semiconductor device SD1D, which may allow for increased density of pillar bumps. For example, in some embodiments, a critical dimension of a pillar bump (e.g., pitch) may be less than about 5 μm, and the pillar bump may have a height less than about 10 μm. The pillar bumps may be formed using any suitable method, such as, depositing a seed layer, optionally forming an under bump metallurgy, using a mask to define a shape of the pillar bumps, electro-chemically plating the pillar bumps in the mask, and subsequently removing the mask and any undesired portions of the seed layer. The pillar bumps may be used to electrically connect the semiconductor device SD1D to other package components such as, a fan-out redistribution layer, package substrates, interposers, printed circuit boards, and the like.

Figure 10:
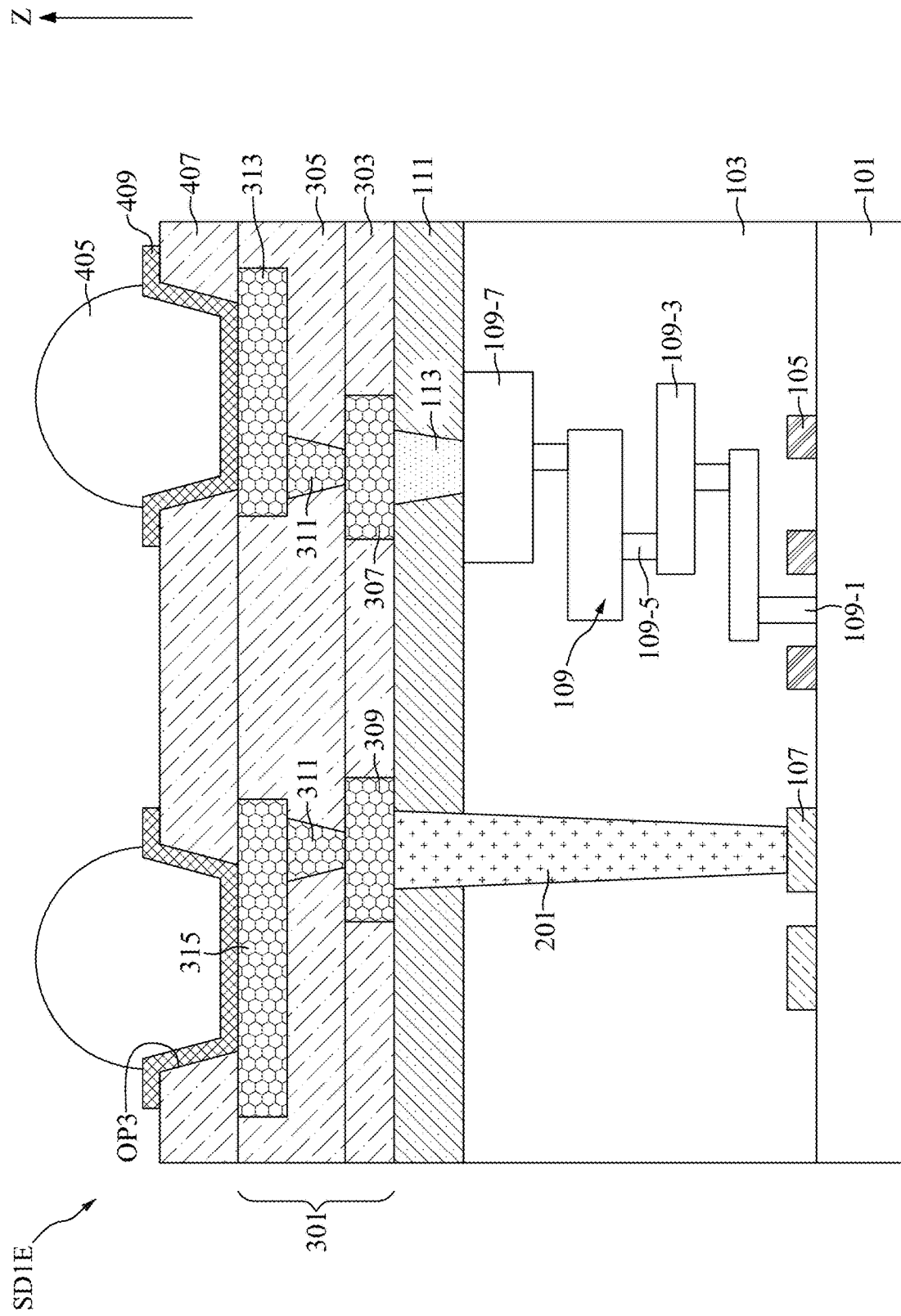

With reference to FIG. 10, the semiconductor device SD1E may have a structure similar to that illustrated in FIG. 9. The same or similar elements in FIG. 10 as in FIG. 9 have been marked with similar reference numbers and duplicative descriptions have been omitted. The semiconductor device SD1E may include a second passivation layer 407 and a plurality of under bump metallization layers 409.

With reference to FIG. 10, the second passivation layer 407 may be disposed on the second insulation layer 305. In some embodiments, the second passivation layer 407 may include polybenzoxazole, polyimide, benzocyclobutene, solder resist film, the like, or a combination thereof. In some other embodiments, the second passivation layer 407 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof. The second passivation layer 407 may be formed by, for example, spin-coating, lamination, deposition, or the like. The deposition may include chemical vapor deposition.

With reference to FIG. 10, third openings OP3 may be respectively correspondingly disposed to expose the top surface of the first top conductive layer 313 and the top surface of the second top conductive layer 315. The plurality of under bump metallization layers 409 may be conformally disposed in the third openings OP3, respectively and correspondingly. The plurality of under bump metallization layers 409 may be electrically coupled to the first top conductive layer 313 and the second top conductive layer 315, respectively and correspondingly. The plurality of first connectors 405 may be respectively correspondingly disposed on the plurality of under bump metallization layers 409.

The under bump metallization layer 409 may be a single layer structure or a stacked structure of multiple layers. For example, the under bump metallization layer 409 may include a first conductive layer, a second conductive layer, and a third conductive layer stacked sequentially. The first conductive layer may serve as an adhesive layer for stably attaching the first connector 405 to the first top conductive layer 313 or the second top conductive layer 315. For example, the first conductive layer may include at least one of titanium, titanium-tungsten, chromium, and aluminum. The second conductive layer may serve as a barrier layer for preventing a conductive material contained in the plurality of first connectors 405 from diffusing into the second passivation layer 407. The second conductive layer may include at least one of copper, nickel, chromium-copper, and nickel-vanadium. The third conductive layer may serve as a seed layer for forming the plurality of first connectors 405 or as a wetting layer for improving wetting characteristics of the plurality of first connectors 405. The third conductive layer may include at least one of nickel, copper, and aluminum.

Figure 11:
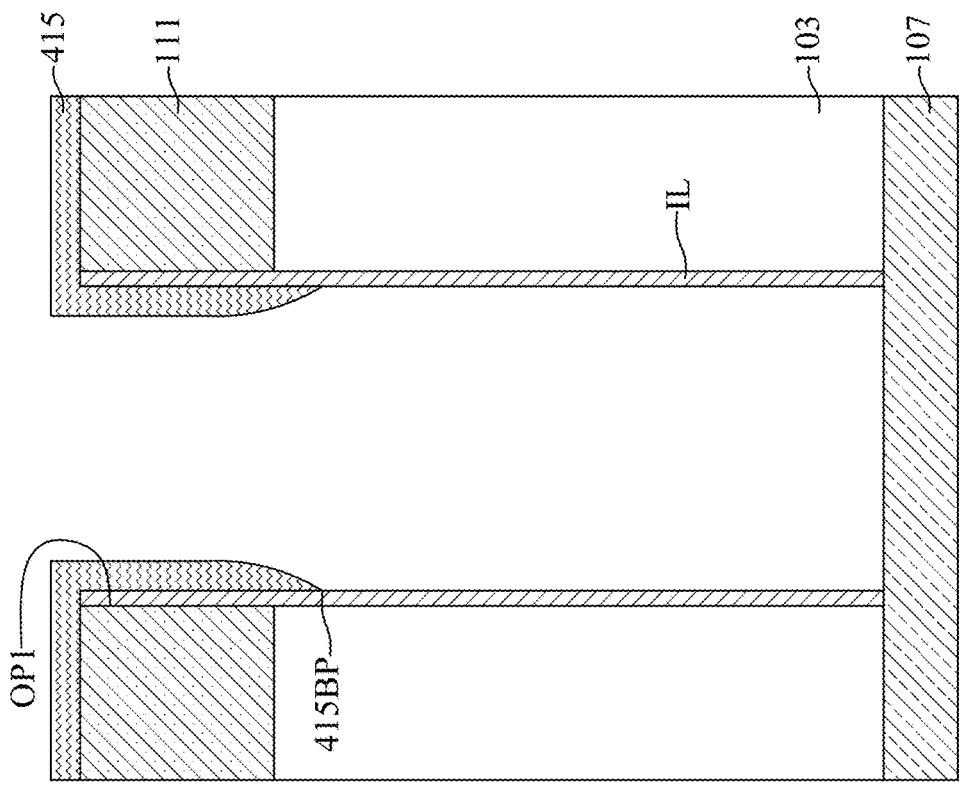
FIGS. 11 to 13 illustrate, in schematic close-up cross-sectional view diagrams, a flow for fabricating a through semiconductor via of a semiconductor device in accordance with another embodiment of the present disclosure.
Figure 12:
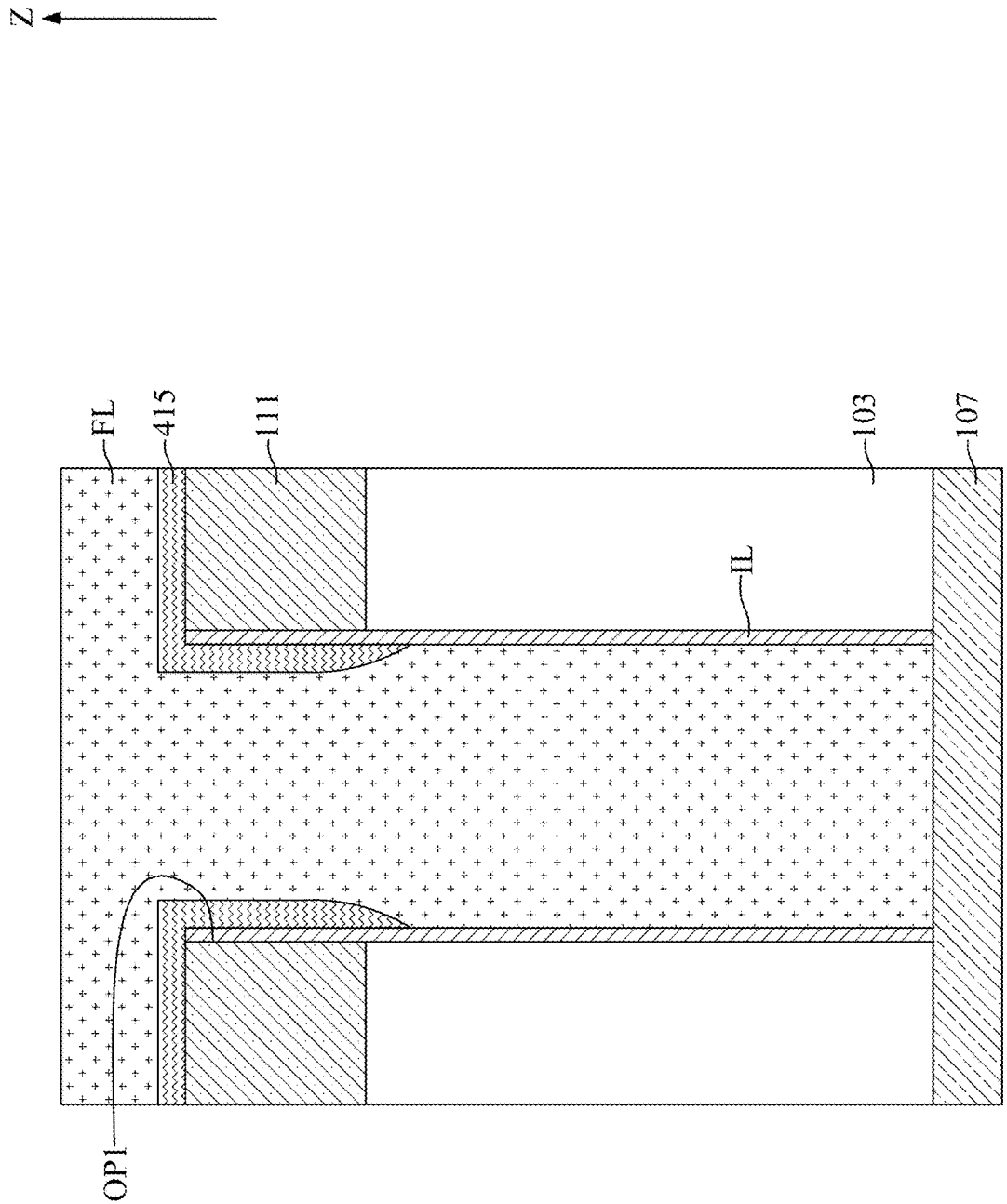
Figure 13:
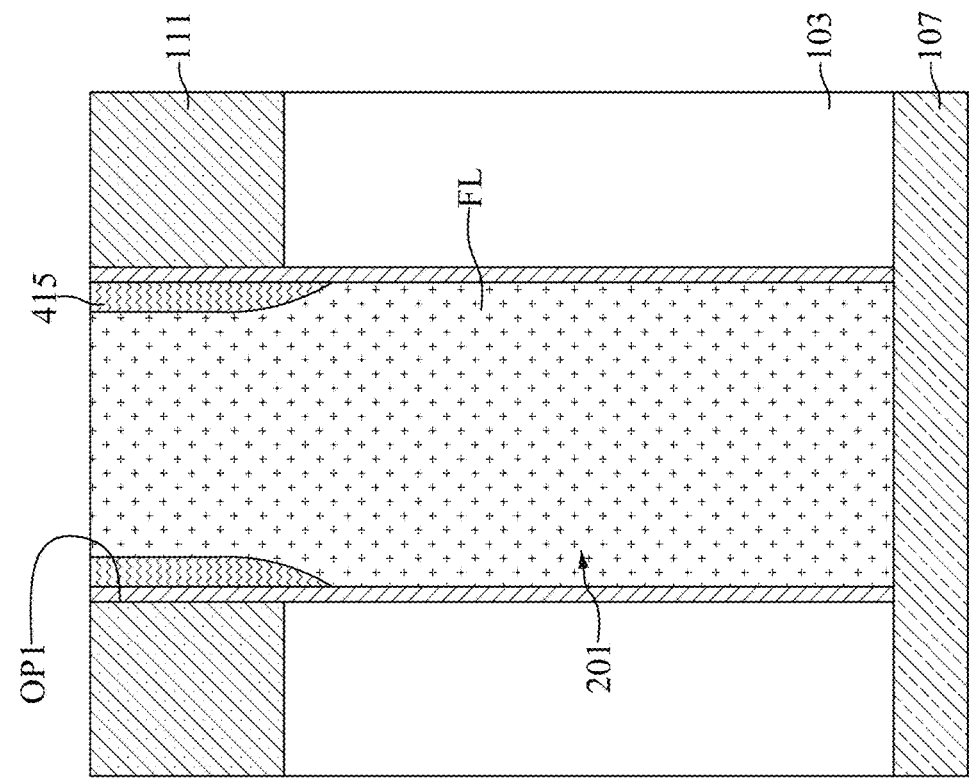

FIGS. 11 to 13 illustrate, in schematic close-up cross-sectional view diagrams, a flow for fabricating a through semiconductor via of a semiconductor device in accordance with another embodiment of the present disclosure.

With reference to FIG. 11, the first opening OP1 may be formed along the first passivation layer 111 and extending to the circuit layer 103. The top surface of the test pad 107 is exposed through the first opening OP1. The inner walls of the first opening OP1 may be slightly tapered such as between about 85 degree to about 88 degree and smooth for conformal and void-free material filling as will be illustrated later. The tapered inner walls of the first opening OP1 may be also improve diffusion of metal ions within the first opening OP1 and may reduce the time for filling the first opening OP1. In addition, the smooth inner walls of the first opening OP1 may be beneficial to reduce stress concentrations. It should be noted that, in the description of the present disclosure, the term "sidewalls" and the term "inner walls" may be used interchangeably.

In some embodiments, the widths of the first opening OP1 may be between about 1 μm and about 22 μm or between about 5 μm and about 15 μm. In some embodiments, the depths of the first opening OP1 may be between about 20 μm and about 160 μm or between about 50 μm and about 130 μm. The first opening OP1 may be formed by, for example, laser drilling, powder blast micromachining, deep reactive ion etching, or wet etching using hydroxides such as potassium hydroxide, sodium hydroxide, rubidium hydroxide, ammonium hydroxide, or tetra methyl ammonium hydroxide.

With reference to FIG. 11, the two insulation layers IL may be formed with a process similar to that illustrated in FIG. 4. Two assistance layers 415 may be conformally formed on the upper part of the first opening OP1, respectively correspondingly attached on the two insulation layers IL, and formed on the top surface of the first passivation layer 111. The bottommost points 415BP of the two assistance layers 415 may be at a vertical level lower than a vertical level of the bottom surface of the first passivation layer 11.

The atomic layer deposition method is a self-limiting, sequential unique film growth technique based on surface reactions that can provide atomic layer control and deposit conformal thin films of materials provided by precursors onto substrates of varying compositions. In the atomic layer deposition method, the precursors are separated during the reaction. The first precursor is passed over the substrate producing a monolayer on the substrate. Any excess unreacted precursor is purged out. A second precursor is then passed over the substrate and reacts with the first precursor, forming a monolayer of film on the substrate surface. This cycle is repeated to create a film of desired thickness.

The two assistance layers 415 may be formed by a deposition process such as an atomic layer deposition method precisely controlling an amount of a first precursor of the atomic layer deposition method. The two assistance layers 415 may be formed of, for example, aluminum oxide, hafnium oxide, zirconium oxide, titanium oxide, titanium nitride, tungsten nitride, silicon nitride, or silicon oxide.

In some embodiments, when the two assistance layers 415 are formed of aluminum oxide, the first precursor of the atomic layer deposition method may be trimethylaluminum and a second precursor of the atomic layer deposition method may be water or ozone.

In some embodiments, when the two assistance layers 415 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the two assistance layers 415 are formed of zirconium oxide, the first precursor of the atomic layer deposition method may be zirconium tetrachloride and the second precursor of the atomic layer deposition method may be water or ozone.

In some embodiments, when the two assistance layers 415 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the two assistance layers 415 are formed of titanium nitride, the first precursor of the atomic layer deposition method may be titanium tetrachloride and ammonia.

In some embodiments, when the two assistance layers 415 are formed of tungsten nitride, the first precursor of the atomic layer deposition method may be tungsten hexafluoride and ammonia.

In some embodiments, when the two assistance layers 415 are formed of silicon nitride, the first precursor of the atomic layer deposition method may be silylene, chlorine, ammonia, and/or dinitrogen tetrahydride.

In some embodiments, when the two assistance layers 415 are formed of silicon oxide, the first precursor of the atomic layer deposition method may be silicon tetraisocyanate or $CH_3OSi(NCO)_3$ and the second precursor of the atomic layer deposition method may be hydrogen or ozone.

With reference to FIG. 12, the filler layer FL may be deposited to completely fill the first opening OP1 and covering the two assistance layers 415. Due to the presence of the two assistance layers 415, the deposition rate of the filling material of the filler layer FL on the inner walls of the first opening OP1 may be reduced. Hence, the deposition rate of the filling material of the filler layer FL on the inner walls of the first opening OP1 and the deposition rate of the filling material of the filler layer FL on the bottom surface of the first opening OP1 may become close to each other. As a result, the first opening OP1 may be filled without any void formation near the bottom surface of the first opening OP1.

With reference to FIG. 13, a planarization process, such as chemical mechanical polishing, may be performed until the top surface of the first passivation layer 111 is exposed to remove excess material and provide a substantially flat surface for subsequent processing steps.

Figure 14:
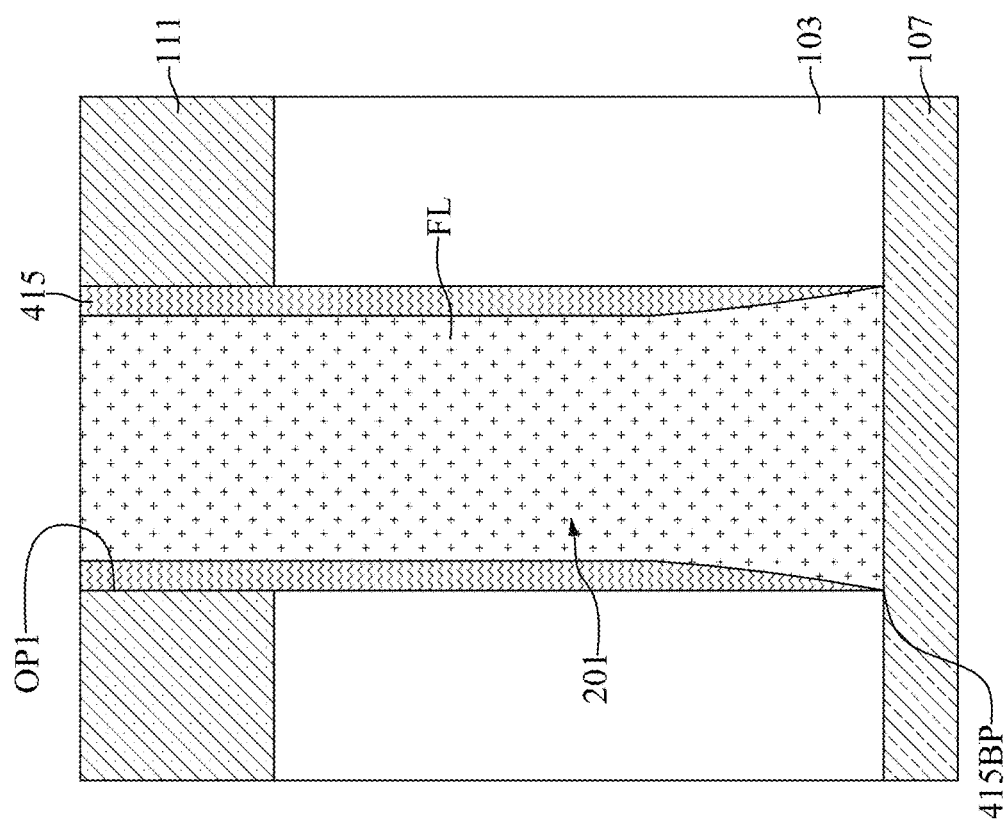
FIGS. 14 and 15 illustrate, in schematic close-up cross-sectional view diagrams, through semiconductor vias of semiconductor devices in accordance with some embodiment of the present disclosure.
Figure 15:
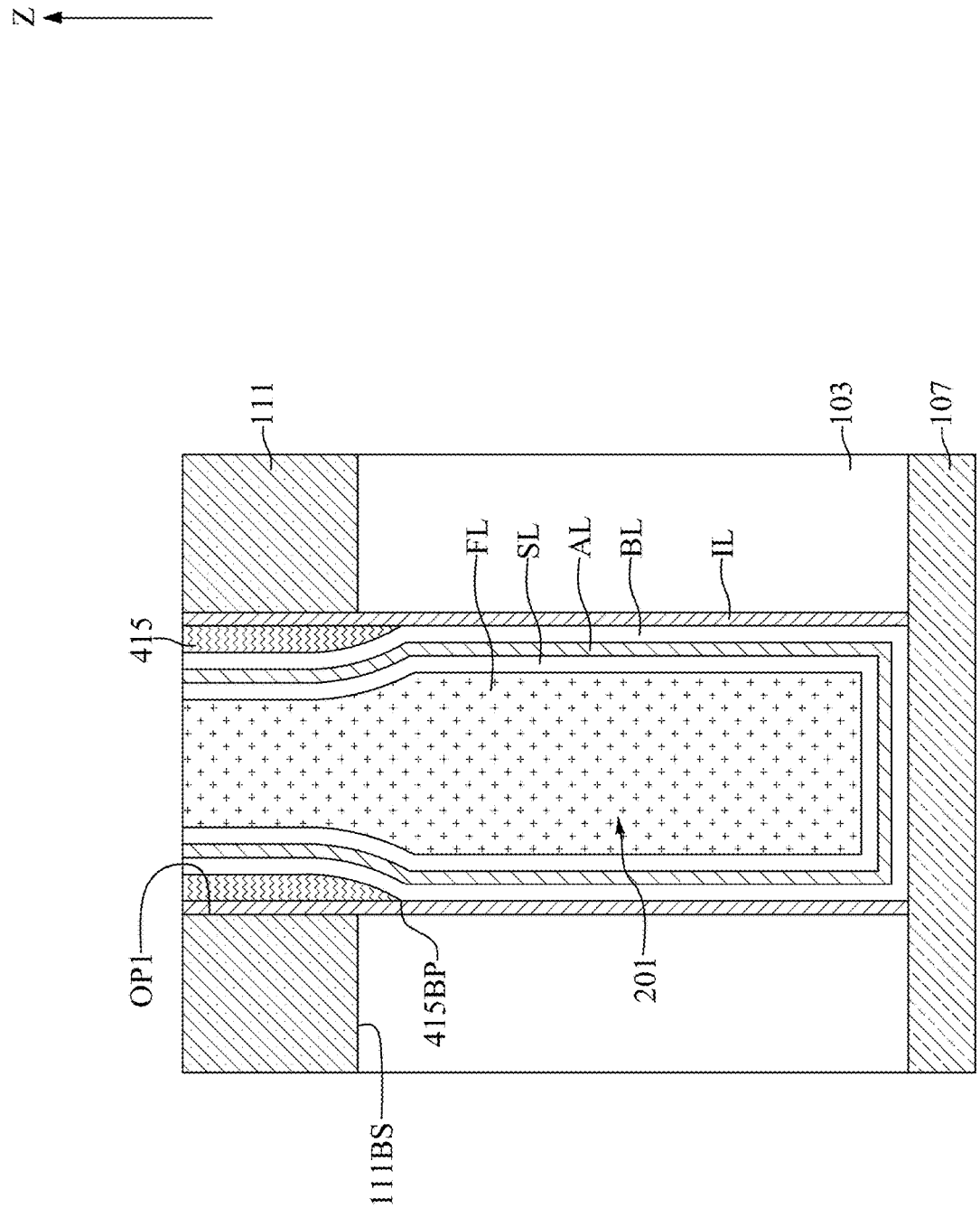

FIGS. 14 and 15 illustrate, in schematic close-up cross-sectional view diagrams, through semiconductor vias of semiconductor devices in accordance with some embodiment of the present disclosure.

With reference to FIG. 14, the through semiconductor via 201 may have a structure similar to that illustrated in FIG. 13. The same or similar elements in FIG. 14 as in FIG. 13 have been marked with similar reference numbers and duplicative descriptions have been omitted. The major difference in FIG. 14 is that the two insulation layers IL (as shown in FIG. 13) may be omitted. The two assistance layers 415 may directly attached on the inner walls of the first opening OP1. The bottommost points 415BP may contact the top surface of the test pad 107. The two assistance layers 415 may replace the two insulation layers IL to ensure the electrical insulation of the through semiconductor via 201. In some embodiments, the bottommost points 415BP may not contact the top surface of the test pad 107.

With reference to FIG. 15, the through semiconductor via 201 may have a structure similar to that illustrated in FIG. 4. The same or similar elements in FIG. 15 as in FIG. 4 have been marked with similar reference numbers and duplicative descriptions have been omitted. The two assistance layers 415 may be respectively correspondingly attached on upper parts of the two insulation layers IL. That is, the two assistance layers 415 may be disposed between the barrier layer BL and the two insulation layers IL.

One aspect of the present disclosure provides a semiconductor device including a substrate, a circuit layer positioned on the substrate and including a functional block positioned on the substrate, and a test pad positioned on the substrate and distal from the functional block, a redistribution structure positioned on the circuit layer and including a first conductive portion positioned over the functional block and electrically coupled to the functional block, and a second conductive portion positioned over the test pad and electrically coupled to the test pad, and a through semiconductor via physically and electrically coupled to the test pad.

Another aspect of the present disclosure provides a method for fabricating a semiconductor device including providing a substrate, forming a circuit layer on the substrate and including a functional block on the substrate, and a test pad on the substrate and distal from the functional block, forming a redistribution structure on the circuit layer and including a first conductive portion over the functional block and electrically coupled to the functional block, and a second conductive portion over the test pad and electrically coupled to the test pad, and forming a through semiconductor via physically and electrically coupled to the test pad.

Due to the design of the semiconductor device of the present disclosure, the semiconductor device SD1A may be in conjunction with testing methodologies that incorporate intermediate and/or final verification of known good dies. As a result, the yield of fabricating the semiconductor device SD1A may be improved and the cost of fabricating the semiconductor device SD1A may be decreased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a circuit layer positioned on the substrate and comprising:
a functional block positioned on the substrate; and
a test pad positioned on the substrate and distal from the functional block;
a redistribution structure positioned on the circuit layer and comprising:
a first conductive portion positioned over the functional block and electrically coupled to the functional block; and
a second conductive portion positioned over the test pad and electrically coupled to the test pad; and
a through semiconductor via physically and electrically coupled to the test pad.

2. The semiconductor device of claim 1, wherein the functional block and the first conductive portion of the redistribution structure are electrically coupled through a multi-level interconnect structure of the circuit layer.

3. The semiconductor device of claim 2, wherein the first conductive portion of the redistribution structure and the second conductive portion of the redistribution structure are electrically coupled.

4. The semiconductor device of claim 2, further comprising a first passivation layer positioned between the circuit layer and the redistribution structure, wherein the first passivation layer comprises polybenzoxazole, polyimide, benzocyclobutene, ajinomoto buildup film, solder resist film, silicon oxynitride, silicon nitride oxide, phosphosilicate glass, borosilicate glass, or boron-doped phosphosilicate glass.

5. The semiconductor device of claim 4, wherein the through semiconductor via comprises:
a filler layer positioned along the first passivation layer and extending to the circuit layer; and
two insulation layers positioned on two sides of the filler layer, wherein the two insulation layers comprise silicon oxide, silicon nitride, silicon oxynitride, tetra-ethyl ortho-silicate, parylene, epoxy, or poly(p-xylene).

6. The semiconductor device of claim 5, wherein the through semiconductor via comprises a seed layer positioned between the two insulation layers and the filler layer and between the filler layer and the test pad, and electrically coupled to the filler layer and the test pad.

7. The semiconductor device of claim 6, wherein the through semiconductor via comprises an adhesive layer positioned between the seed layer and the two insulation layers and between the seed layer and the test pad, and electrically coupled to the seed layer and the test pad, wherein the adhesive layer comprises titanium, tantalum, titanium tungsten, or manganese nitride.

8. The semiconductor device of claim 7, wherein the through semiconductor via comprises a barrier layer positioned between the adhesive layer and the two insulation layers and between the adhesive layer and the test pad, and electrically coupled to the adhesive layer and the test pad, wherein the barrier layer comprises tantalum, tantalum nitride, titanium, titanium nitride, rhenium, nickel boride, or tantalum nitride/tantalum bilayer.

9. The semiconductor device of claim 4, wherein sidewalls of the through semiconductor via are tapered.

10. The semiconductor device of claim 4, wherein the functional block comprises a complementary metal-oxide-semiconductor transistor, a metal-oxide-semiconductor field-effect transistor, or a fin field-effect-transistor, or the like.

11. The semiconductor device of claim 4, wherein the redistribution structure comprises a first insulation layer positioned on the first passivation layer, and the first conductive portion and the second conductive portion are positioned in the first insulation layer, wherein the first insulation layer comprises polybenzoxazole, polyimide, benzocyclobutene, solder resist film, silicon oxynitride, silicon nitride oxide, phosphosilicate glass, borosilicate glass, or boron-doped phosphosilicate glass.

12. The semiconductor device of claim 11, wherein the second conductive portion of the redistribution structure comprises:
a conductor layer positioned in the first insulation layer and electrically coupled to the through semiconductor via; and
a barrier layer positioned between the first insulation layer and the conductor layer, between the circuit layer and the conductor layer, and between the through semiconductor via and the conductor layer.

13. The semiconductor device of claim 12, wherein the second conductive portion of the redistribution structure comprises a seed layer positioned between the conductor layer and the barrier layer.

14. The semiconductor device of claim 4, further comprising a thermal dissipation layer positioned below the substrate, wherein the thermal dissipation layer comprises vertically oriented graphite and carbon nanotubes.

15. The semiconductor device of claim 14, further comprising an attachment layer positioned between the thermal dissipation layer and the substrate, wherein the attachment layer comprises die attach film, silver paste, or the like.

16. The semiconductor device of claim 4, further comprising a plurality of first connectors positioned on the redistribution structure and respectively correspondingly electrically coupled to the first conductive portion of the redistribution structure and the second conductive portion of the redistribution structure, wherein the plurality of first connectors comprises solder joints, bumps, pillar bumps, or the like.

17. The semiconductor device of claim 16, further comprising a plurality of under bump metallization layer respectively correspondingly positioned between the plurality of first connectors and the redistribution structure.

18. The semiconductor device of claim 5, wherein the through semiconductor via comprises two assistance layers respectively correspondingly positioned between the two insulation layers and the filler layer, wherein bottommost points of the two assistance layers are at a vertical level lower than a vertical level of a bottom surface of the first passivation layer.

19. A method for fabricating a semiconductor device, comprising:
- providing a substrate;
- forming a circuit layer on the substrate and comprising:
  - a functional block on the substrate; and
  - a test pad on the substrate and distal from the functional block;
- forming a through semiconductor via physically and electrically coupled to the test pad; and
- forming a redistribution structure on the circuit layer and comprising:
  - a first conductive portion over the functional block and electrically coupled to the functional block; and
  - a second conductive portion over the test pad and electrically coupled to the test pad through the through semiconductor via.

20. The method for fabricating the semiconductor device of claim 19, further comprising forming a plurality of first connectors on the redistribution structure and respectively correspondingly electrically coupled to the first conductive portion of the redistribution structure and the second conductive portion of the redistribution structure, wherein the plurality of first connectors comprises solders, bumps, pillar bumps, or the like.

* * * * *